United States Patent [19]
Khosravi et al.

[11] Patent Number: 5,408,138
[45] Date of Patent: Apr. 18, 1995

[54] FLIP FLOP CIRCUIT AND METHOD THEREFOR

[75] Inventors: Kory Khosravi, Santa Clara, Calif.; Victor D. Ehrlich, Mesa; John K. Mahabadi, Tempe, both of Ariz.

[73] Assignee: Motorola, Inc., Schaumburg, Ill.

[21] Appl. No.: 130,892

[22] Filed: Oct. 4, 1993

[51] Int. Cl.$^6$ .......................................... H03K 3/289
[52] U.S. Cl. .................................... 327/203; 365/154
[58] Field of Search ................ 307/272.1, 272.2, 279, 307/452, 480; 365/154

[56] References Cited

U.S. PATENT DOCUMENTS

| | | | |
|---|---|---|---|
| 4,656,368 | 4/1987 | McCombs et al. | 307/272.2 |
| 5,049,760 | 9/1991 | Ooms | 307/272.2 |
| 5,200,650 | 4/1993 | Cowley et al. | 307/272.2 |

*Primary Examiner*—Joseph A. Popek
*Attorney, Agent, or Firm*—Gary W. Hoshizaki

[57] ABSTRACT

A storage cell circuit (11) comprises a voltage reduction circuit (17), a latch (18), and a tri-state driver circuit (19). The latch (18) has a terminal (14) and a terminal (16) for providing data stored therein. The voltage reduction circuit (17) couples to the power terminal of the latch (18) and reduces the voltage powering the latch. The tri-state driver circuit (19) has a clock input (12), a data input (13), a terminal coupled to the terminal (14), and a terminal coupled to the terminal (16). A clock signal applied to the clock input (12) has a first phase and a second phase. During the first phase of the clock, the terminals of the tri-state driver circuit (19) are at a high impedance leaving the data stored in the latch (18) undisturbed. During the second phase of the clock, the tri-state driver circuit (19) provides complementary signals of a data signal applied to the data input (13) for writing to the latch (18).

11 Claims, 2 Drawing Sheets

FLIP FLOP CIRCUIT AND METHOD THEREFOR

BACKGROUND OF THE INVENTION

This invention relates, in general, to storage circuits and more particularly to flip flop circuits.

Flip flop circuits are an essential building block for most digital circuits. In fact, flip flops are used in virtually every digital integrated circuit manufactured. Gate arrays and standard cell libraries devote large numbers of their cells to flip flop designs. Most of the flip flops included in a library have minor variations such as a scan input or set/reset options.

It is well known that the speed at which a digital circuit operates is determined by its worst case data path. Flip flop delay can be a large portion of the worst case delay due to their high proclivity of use in digital designs. By concentrating on reducing flip flop delays, it is possible to significantly increase speeds of digital systems.

A flip utilizes a full clock cycle to shift data from the input to the output. One common type of flip flop is a D-flip flop. The D-flip flop (as well as many other flip flop designs) is formed in two distinct sections. The two sections are called a master and a slave section. The master section receives and stores data coupled to the flip flop input during one phase of the clock cycle. The data is shifted from the master section to the slave section during the other phase of the clock cycle. The slave section stores and provides the data at the flip flop outputs.

A latch is commonly used to store data in either the master or slave section of the flip flop. The existing data must be over-written in order for the new data to be stored in the latch. The circuit driving the latch to its new logic state must be strong enough to overcome the latch to write the new data in. Writing data in a latch is a significant portion of the delay in either the master or slave sections.

In general, the slave section has more elements in its data path than the master section. This results in the slave section having a disproportionate amount of delay when compared to the master section. Since most digital systems are clocked using a 50 percent duty cycle clocking scheme the benefits of reducing the master section delay would be negligible until the slave section delay is less than the master section delay. Thus, optimization of the slave section will greatly increase clock rates of a flip flop.

It would be of great benefit if a circuit could be provided which stores data and is easily overwritten while having minimal delay thereby increasing the operating speed of the circuit.

SUMMARY OF THE INVENTION

Briefly stated, there is provided a storage cell circuit for receiving and storing data. The storage cell circuit comprises a voltage reduction circuit, a latch, and a tri-state driver circuit. The latch stores data and includes a first terminal, a second terminal, and a power terminal. The voltage reduction circuit couples to the power terminal of the latch. The tri-state driver circuit includes a clock input, a data input, a terminal coupled to the first terminal of the latch, and a terminal coupled to the second terminal of the latch. A clock signal having a first phase and a second phase is applied to the clock input. During the first phase of the clock signal the terminals of the tri-state driver circuit are at a high impedance leaving data stored in the latch undisturbed. During the second phase of the clock signal the tri-state driver provides complementary data signals of a data signal applied to the data input at the first and second terminals of the latch for writing the data signal to the latch.

A method for reducing delay when writing to a latch is also provided. The latch includes a first terminal, a second terminal, and a power terminal. The voltage applied to the power terminal of the latch is decreased causing the latch to provide logic levels at the first and second terminals of a first magnitude. This reduces the drive needed to overwrite the latch. Data is written to the latch by providing complementary signals to the first and second terminals of a second magnitude. The second magnitude signals are larger than the first magnitude signals.

DETAILED DESCRIPTION OF THE DRAWINGS

Figure 1:
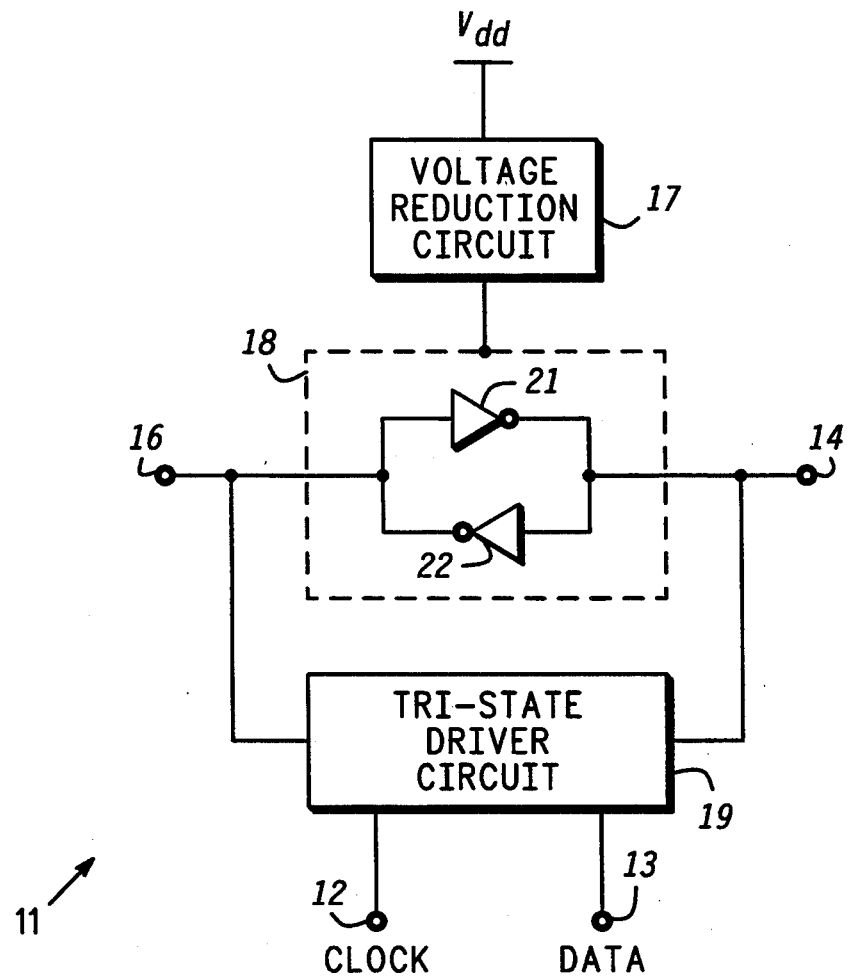
FIG. 1 is a block diagram of a storage cell circuit in accordance with the present invention.

FIG. 1 is a block diagram of a storage cell circuit 11 that stores data and is easily overwritten with minimal delay. Storage cell circuit 11 includes a clock input 12, a data input 13, an output 14, and an output 16. Storage cell circuit 11 comprises a voltage reduction circuit 17, a latch 18, and a tri-state driver circuit 19. The voltage reduction circuit 17 is coupled to a power supply Vdd and includes a terminal for providing a voltage having a magnitude less than that provided by power supply Vdd.

Latch 18 includes a first terminal coupled to output 14, a second terminal coupled to output 16, and a power terminal coupled to the terminal of voltage reduction circuit 17. Latch 18 comprises an inverter 21 and an inverter 22. Inverter 21 includes an input coupled to output 16 and an output coupled to output 14. Inverter 22 has an input coupled to output 14 and an output coupled to output 16. Both inverters are powered by the reduced voltage provided by voltage reduction circuit 17. By supplying a voltage to latch 18 with a voltage lower than the supply voltage two benefits for increasing writing speed to latch 18 are obtained. First, lowering the voltage reduces the magnitude between logic levels output by latch 18. The time to transition from a one logic state to a zero logic state (and vice versa) is less since there is a smaller voltage to transition. Second, the latch is slightly weakened by lowering the voltage which makes it easier for circuits with the standard logic levels to over-write latch 18.

Tri-state driver circuit 19 includes an input coupled to clock input 12, an input coupled to data input 13, an output coupled to output 14, and an output coupled to output 16.

Storage cell circuit 11 operates in two modes. In a first mode, a first phase of a clock signal applied to clock input 12 disables tri-state driver circuit 19 such that both outputs are in a high impedance state. Data stored in latch 18 remains undisturbed. In the second mode, which is analogous to loading data into the slave section of a flip flop, the clock signal is in the second phase. Tri-state driver 19 provides complementary data signals corresponding to a data signal applied to data input 13 that over-writes latch 18. Powering latch 18 with a reduced voltage in combination with simultaneously over-writing latch 18 from both outputs 14 and 16 significantly reduces delay in the second mode of operation of storage cell circuit 11.

Figure 2:
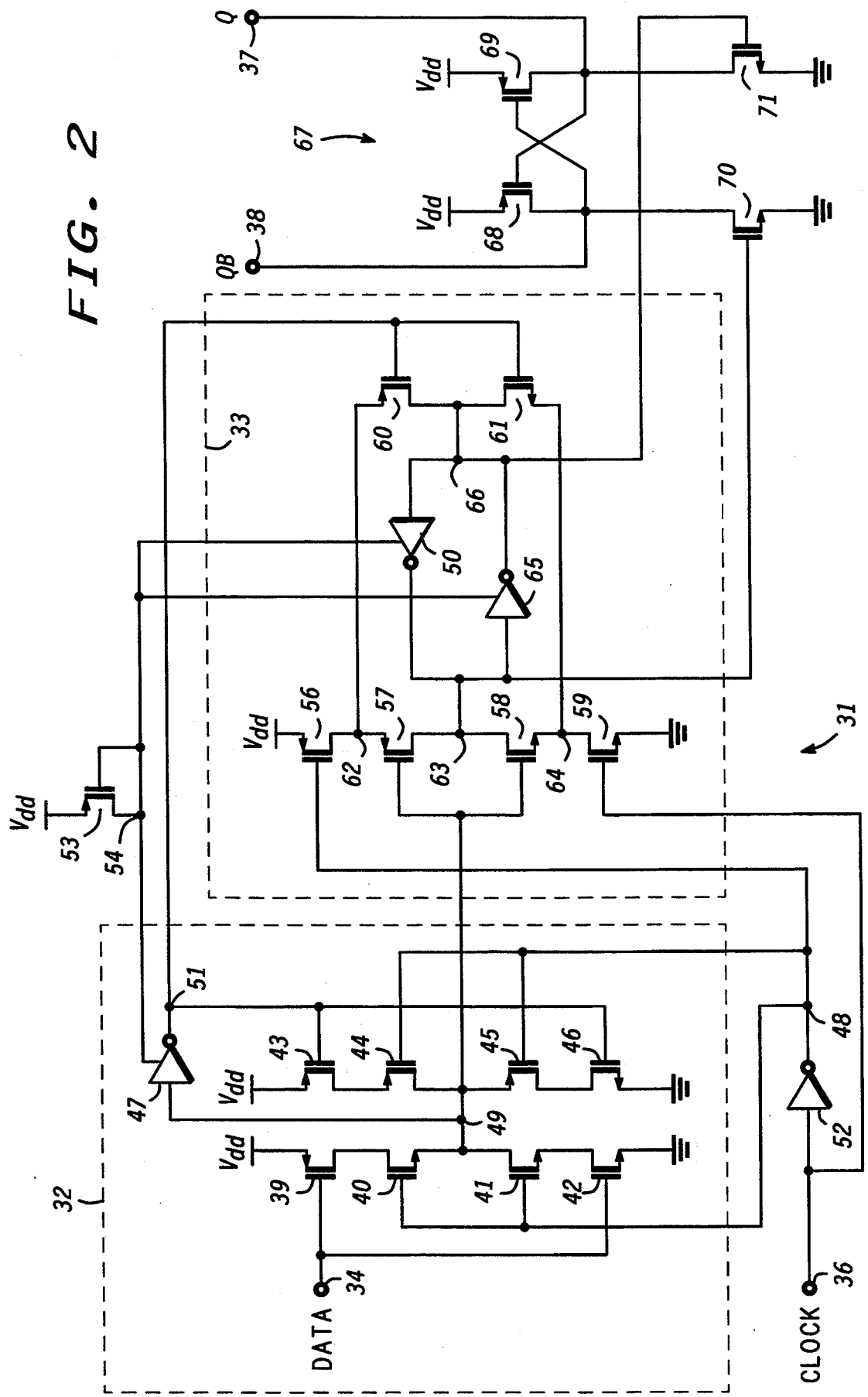
FIG. 2 is a schematic/block diagram of a flip flop in accordance with the present invention.

FIG. 2 is a schematic of a flip flop 31 in accordance with the present invention. Flip flop 31 is configured as a D-flip flop. D-flip flops are well known in the art and are widely used in most digital integrated circuit designs. It should be noted that the D-flip flop is used for illustration purposes and the invention disclosed herein is applicable for many types of storage circuits. Flip flop 31 is divided into a master section 32 and a slave section 33. Flip flop 31 includes a data input 34, a clock input 36, a Q output 37, and a QB output 38. An inverter 52 has an input coupled to clock input 36 and an output coupled to a node 48. Inverter 52 provides an inverted clock signal within flip flop 31.

Master section 32 comprises transistors 39-46 and inverter 47. Transistors 39, and 43-45 are p-channel enhancement MOSFETs (metal oxide semiconductor field effect transistors). Transistors 40-42 and 46 are n-channel enhancement MOSFETs. Transistors 39-46 each have a drain, a gate, and a source that corresponds respectively to a first electrode, a control electrode, and a second electrode.

Transistors 39-42 form a clocked inverter for passing data into the master section. Transistor 39 has the source coupled to a terminal of a power supply Vdd and the gate coupled to data input 34. Transistor 40 has the drain coupled to the drain of transistor 39, the gate coupled to node 48, and the source coupled to a node 49. Transistor 41 has the drain coupled to node 49 and the gate coupled to node 48. Transistor 42 has the drain coupled to the source of transistor 41, the gate coupled to data input 34, and the source coupled to ground. A one logic level applied to clock input 36 produces a zero logic level at the output of inverter 52 (node 48). The zero or low logic level at node 48 disables transistors 40 and 41 leaving the clocked inverter in a high impedance state.

A zero logic level applied to clock input 36 produces a one logic level at the output of inverter 52 (node 48). The one or high logic level at node 48 enables transistors 40 and 41. A data signal applied to data input 34 couples to transistors 39 and 42. Either transistor 39 or transistor 42 is enabled by the data signal generating an inverted data signal at node 49.

Transistors 43-46 form another clocked inverter that in combination with inverter 47 forms a clocked latch. Transistor 43 has the source coupled to the terminal of power supply Vdd and the gate coupled to node 51. Transistor 44 has the source coupled to the drain of transistor 43, the gate coupled to node 48, and the drain coupled to a node 49. Transistor 45 has the source coupled to node 49 and the gate coupled to node 48. Transistor 46 has the drain coupled to the drain of transistor 45, the gate coupled to node 51, and the source coupled to ground. Inverter 47 has an input coupled to node 49, an output coupled to node 51, and a power terminal coupled to a node 54.

The clocked latch increases speed of master section 32 by reducing drive requirements of transistors 39-42 to overwrite the latch. The clocked latch is disabled by a one logic level at node 48 (transistors 44 and 45 are disabled). The clocked inverter formed by transistors 39-42 is enabled to drive node 49 to a new logic state.

A zero logic state at node 48 enables the clocked latch. Transistor 40 and 41 are disabled by the zero logic state and no longer drive node 49. The clocked inverter formed by transistors 43-46 is enabled. The clocked inverter together with inverter 47 feedback on one another to hold the logic levels at nodes 49 and 51.

A transistor 53 corresponds to the voltage reduction circuit 17 of FIG. 1. Transistor 53 powers inverter 47 and circuitry of slave section 33. Transistor 53 is a p-channel enhancement MOSFET having a drain, a gate, and a source corresponding respectively to a first electrode, a control electrode, and a second electrode. Transistor 53 has the source coupled to the terminal of power supply Vdd and the gate and drain coupled to node 54. Transistor 53 is in a "diode like" configuration for reducing the voltage at node 54. The gate to source voltage drop produced by transistor 53 is slightly greater than the threshold voltage of the device under static conditions. Transistor 53 provides current under dynamic conditions to circuitry coupled to node 54.

Slave section 33 comprises transistors 56-61, and inverters 50 and 65. Transistors 56, 57 and 60 are p-channel enhancement MOSFETs. Transistors 58, 59, and 61 are n-channel enhancement MOSFETs. Transistors 56-61 each have a drain, a gate, and a source corresponding to a first electrode, a control electrode, and a second electrode.

Transistors 56-61 form a tri-state driver circuit corresponding to the block in FIG. 1. Transistors 56-59 provide an inverted signal of the data stored in master section 32 at node 49. Similarly, transistors 60 and 61 are configured to provide a non-inverted signal of the data stored in master section at node 49. Transistor 56 has a source coupled to the terminal of power supply Vdd, a gate coupled to node 48, and a drain coupled to a node 62. Transistor 57 has the source coupled to node 62, the gate coupled to node 49, and the drain coupled to a node 63. Transistor 58 has the drain coupled to node 63, the gate coupled to node 49, and the source coupled to a node 64. Transistor 59 has the drain coupled to node 64, the gate coupled to clock input 36, and the source coupled to ground. Transistor 60 has the source coupled to node 62, the gate coupled to node 51, and the drain coupled to a node 66. Transistor 61 has the drain coupled to node 66, the gate coupled to node 51, and the source coupled to node 64.

Inverters 50 and 65 form a latch. Inverter 50 has an input coupled to node 66, an output coupled to a node 63, and a power terminal coupled to node 54. Inverter 65 has an input coupled to node 63, an output coupled to node 66, and a power terminal coupled to node 54. The outputs of inverters 50 and 65 provide complementary signals of the data being stored therein.

Figure 3:
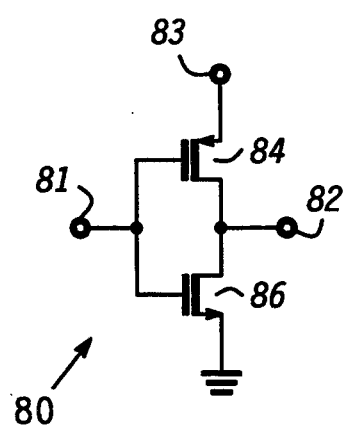
FIG. 3 is a schematic diagram of an inverter used in both FIGS. 1 and 2.

Note that inverters 47, 62 and 63 each have their respective power terminals coupled to node 54. FIG. 3 is a schematic of an inverter 80 illustrating the power terminal and corresponds to inverters of FIGS. 1 and 2. Inverter 80 includes an input 81, an output 82, and a power terminal 83. Inverter 80 comprises transistors 84 and 86. Transistor 84 is a p-channel enhancement MOSFET having a drain coupled to output 82, a gate coupled to input 81, and a source coupled to power terminal 83. Transistor 86 is a n-channel enhancement MOSFET having a drain coupled to output 82, a gate coupled to input 81, and a source coupled to ground. Coupling the power terminals of inverters 47, 62, and 63 to the reduced voltage at node 54 reduces the magnitude between logic levels provided at each output.

In the preferred embodiment, a level shifter 67 is used to eliminate leakage problems due to the reduced logic levels provided by the latch formed by inverters 50 and 65. Level shifter 67 shifts the logic levels back to normal levels. Level shifter 67 comprises transistors 68–71. Transistors 68 and 69 are p-channel enhancement MOSFETs. Transistors 70 and 71 are n-channel enhancement MOSFETs. Transistors 68–71 each have a drain, a gate, and a source corresponding to a first electrode, a control electrode, and a second electrode. Transistor 68 has the source coupled to the terminal of power supply Vdd, the gate coupled to Q output 37, and the drain coupled to QB output 38. Transistor 69 has the source coupled to the terminal of power supply Vdd, the gate coupled to the QB output 38, and the drain coupled to Q output 37. Transistor 70 has the drain coupled to QB output 38, the gate coupled to node 63, and the source coupled to ground. Transistor 71 has the drain coupled to Q output 37, the gate coupled to node 66, and the source coupled to ground.

Operation of flip flop 31 is best explained through an example. Assume Q output is at a one logic level and a data signal applied to data input 34 is at a one logic level. Node 49 and node 66 are at a zero logic level. Node 63 is at a one logic level and a clock signal applied to clock input 36 is at a one logic level. Normal logic levels are provided by circuitry of flip flop 31 except inverters 47, 62, and 63 which provide reduced logic levels due to the lower voltage at node 54.

The data signal transitions to a zero logic level followed by the clock signal transitioning to a zero logic level. Transistor 39 and transistor 40 are respectively enabled by the data signal (zero logic level) and the inverter clock signal (one logic level) generating a one logic state at node 49 and a zero logic state at node 51. Transistors 44 and 45 are disabled by the inverted clock signal so the latch formed by transistors 43–36 and inverter 47 is disabled. Transistors 56 and 59 are respectively disabled by the inverted clock signal (node 48) and the clock signal thus nodes 63 and 66 remain unchanged. The data signal (although inverted) has been loaded into the master section of flip flop 31.

The clock signal then transitions from the zero logic state to a one logic state. Transistors 40 and 41 are disabled by the inverted clock signal (zero logic level) decoupling the data signal from node 49. Transistor 43 and transistor 44 are respectively enabled by the inverted clock signal (zero logic level) and the output of inverter 47 (zero logic level). This latches the data at node 49 (one logic level) and node 51 (zero logic level).

Transistors 58 and 59 are respectively enabled by node 49 (one logic level) and the clock signal (one logic level) transitioning node 63 from a one logic level to a zero logic level. Simultaneously with transistors 58 and 59 being enabled, transistors 56 and 60 are respectively enabled by the inverted clock signal (zero logic level) and node 51 (zero logic level) which transitions node 66 from the zero logic level to a one logic level. Level shifter 67 has Q output 37 transitioning from the one logic level to a zero logic level and the QB output transitioning from a zero logic level to a one logic level.

Transistors 56 and 59 are disabled when the clock signal transitions back to a zero logic level. The latch formed by inverters 50 and 65 hold the stored logic levels just shifted in. New data is loaded into master section 32. Loading in a one logic level is analogous to the example described above.

By now it should be appreciated that a flip flop has been provided that operates at higher frequencies. By reducing signal swing levels in the slave section of the flip flop in combination with driving both ends of the storage latch provided therein produce significant delay reductions.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A flip flop including a clock input, a data input, a Q output, and a QB output comprising:
   a master section including a first input coupled to the clock input, a second input coupled to the data input, and an output, said master section for storing a data signal applied to said data input of the flip flop when a clock signal applied to the clock input is in a first phase;
   a slave section comprising:
      a latch for storing data including a first terminal coupled to the Q output, and a second terminal coupled to the QB output; and
      a tri-state driver circuit a first input coupled to the clock input, a second input coupled to said output of said master section, a first terminal coupled to said first terminal of said latch, and a second terminal coupled to said second terminal of said latch, said first and second terminals of said tri-state driver for providing high impedance during said first phase of said clock signal, said tri-state driver circuit for receiving data from said master section and for providing complementary data signals for writing data to said latch during a second phase of a clock signal.

2. A flip flop as recited in claim 1 wherein the flip flop further includes a first inverter having an input coupled to the clock input and an output, said inverter providing an inverted clock signal to said master and slave sections.

3. A flip flop as recited in claim 2 further including a voltage reduction circuit being coupled to receive a first supply voltage and a second terminal for providing a voltage having a magnitude less than said first supply voltage to said master and slave sections.

4. A flip flop as recited in claim 3 wherein said master section includes:
   a first clocked inverter including a first input coupled to the data input, a second input coupled to said output of said first inverter, and an output coupled to said output of said master section;
   a second inverter including an input coupled to said output of said master section and an output; and
   a second clocked inverter including a first input coupled to said output of said second inverter, and a second input coupled to said output of said first inverter, and an output coupled to said output of said master section.

5. A flip flop as recited in claim 4 wherein said second inverter further includes a power terminal coupled to said second terminal of said voltage reduction circuit for reducing the magnitude of logic levels produced therefrom.

6. A flip flop as recited in claim 5 wherein said latch comprises:
- a third inverter having an input and an output respectively coupled to said first and second terminals of said latch, and a power terminal coupled to said second terminal of said voltage reduction circuit; and
- a fourth inverter having an input and an output respectively coupled to said second and first terminals of said latch, and a power terminal coupled to said second terminal of said voltage reduction circuit.

7. A flip flop as recited in claim 6 wherein said tri-state driver circuit comprises:
- a first transistor of a first conductivity type having a first electrode, a control electrode coupled to said output of said first inverter, and a second electrode being coupled to receive said first supply voltage;
- a second transistor of said first conductivity type having said first conductivity type having a first electrode coupled to said first terminal of said latch, a control electrode coupled to said output of said master section, and a second electrode coupled to said output first electrode of said first transistor;
- a third transistor of a second conductivity type having a first electrode coupled to said first terminal of said latch, a control electrode coupled to said output of said master section, and a second electrode;
- a fourth transistor of said second conductivity type having a first electrode coupled to said second electrode of said third transistor, a control electrode coupled to the clock input, and a second electrode being coupled to receive a second supply voltage;
- a fifth transistor of said first conductivity type having a first electrode coupled to said second terminal of said latch, a control electrode coupled to said output of said second inverter, and a second electrode coupled to said first electrode of said first transistor; and
- a sixth transistor of said second conductivity type having a first electrode coupled to said second terminal of said latch, a control electrode coupled to said output of said second inverter, and a second electrode coupled to said first electrode of said fourth transistor.

8. A flip flop as recited in claim 6 further including a level shift circuit having a first input coupled to said first terminal of said latch, a second input coupled to said second terminal of said latch, a first output coupled to the QB output of the flip flop, and a second output coupled to the Q output of the flip flop.

9. A flip flop as recited in claim 8 wherein said level shift circuit comprises:
- a first transistor of a first conductivity type having a first electrode coupled to the QB output of the flip flop, a control electrode coupled to the Q output of the flip flop, and a second electrode being coupled to receive said first supply voltage;
- a second transistor of a second conductivity type having a first electrode coupled to the QB output of the flip flop, a control electrode coupled to said first terminal of said latch, and a second electrode being coupled to receive a second supply voltage;
- a third transistor of said first conductivity type having a first electrode coupled to the Q output of the flip flop, a control electrode coupled to the QB output of the flip flop, and a second electrode being coupled to receive said first supply voltage; and
- a fourth transistor of said second conductivity type having a first electrode coupled to the Q output of the flip flop, a control electrode coupled to said second terminal of said latch, and a second electrode being coupled to receive said second supply voltage.

10. A flip flop as recited in claim 4 wherein said first clocked inverter comprises:
- a first transistor of a first conductivity type having a first electrode, a control electrode coupled to the data input, and a second electrode being coupled to receive said first supply voltage;
- a second transistor of a second conductivity type having a first electrode coupled to said first electrode of said first transistor, a control electrode coupled to said output of said first inverter, and a second electrode coupled to said output of said master section;
- a third transistor of said second conductivity type having a first electrode coupled to said output of said master section, a control electrode coupled to said output of said first inverter, and a second electrode; and
- a fourth transistor of said second conductivity type having a first electrode coupled to said second electrode of said third transistor, a control electrode coupled to the data input, and a second electrode being coupled to receive a second supply voltage.

11. A flip flop as recited in claim 4 wherein said second clocked inverter comprises:
- a first transistor of a first conductivity type having a first electrode, a control electrode coupled to said output of said second inverter, and a second electrode being coupled to receive said first supply voltage;
- a second transistor of said first conductivity type having a first electrode coupled to said output of said master section, a control electrode coupled to said output of said first inverter, and a second electrode coupled to said first electrode of said first transistor;
- a third transistor of said first conductivity type having a first electrode, a control electrode coupled to said to said output of said first inverter, and a second electrode coupled to said output of said master section; and
- a fourth transistor of a second conductivity type having a first electrode coupled to said first electrode of said third transistor, a control electrode coupled to said output of said second inverter, and a second electrode being coupled to receive a second supply voltage.

* * * * *